(12) United States Patent
Yang

(10) Patent No.: US 7,566,248 B2
(45) Date of Patent: Jul. 28, 2009

(54) EXPANDABLE FUNCTION DATA STORAGE DEVICE

(75) Inventor: Shih-An Yang, Taipei (TW)

(73) Assignee: Inventec Multimedia & Telecom Corporation, Taipei (TW)

( * ) Notice: Subject to any disclaimer, the term of this patent is extended or adjusted under 35 U.S.C. 154(b) by 843 days.

(21) Appl. No.: 11/250,474

(22) Filed: Oct. 17, 2005

(65) Prior Publication Data

US 2007/0168009 A1    Jul. 19, 2007

(51) Int. Cl.
*H01R 25/00* (2006.01)
(52) U.S. Cl. .................. 439/638; 361/735; 361/752
(58) Field of Classification Search .............. 439/638; 361/715, 735, 752, 785
See application file for complete search history.

(56) References Cited

U.S. PATENT DOCUMENTS

| | | | |
|---|---|---|---|
| 6,522,534 B1 | 2/2003 | Wu | |
| 6,733,329 B2 * | 5/2004 | Yang | 439/518 |
| 6,744,634 B2 | 6/2004 | Yen | |
| 6,763,410 B2 * | 7/2004 | Yu | 710/74 |
| 7,068,517 B2 * | 6/2006 | Yen | 361/752 |

* cited by examiner

*Primary Examiner*—Dean A. Reichard
*Assistant Examiner*—Andargie M Aychillhum
(74) *Attorney, Agent, or Firm*—Harness, Dickey & Pierce, P.L.C.

(57) ABSTRACT

An expandable function data storage device includes a first main body and a second main body. The first main body has a memory circuit unit. Its first end is exposed outside and has a first signal communication port and its second end has a second signal transmission port. The second main body has a reception space and can be sleeved on and connected to the first main body, to protect the first signal transmission port. Specifically, the second main body includes an application circuit unit, and a third signal transmission port is provided in the reception space. When the second main body is sleeved on and connected to the second end of the first main body, the second signal transmission port is electrically connected to the third signal transmission port, so that the memory circuit unit may transmit/receive data to/from the application circuit unit.

21 Claims, 6 Drawing Sheets

EXPANDABLE FUNCTION DATA STORAGE DEVICE

BACKGROUND OF THE INVENTION

1. Field of the Invention The invention relates to a data storage device, more particularly to an expandable function data storage device.

2. Description of the Related Art

With the rapid progress and development of science and technology, the functions of electronic devices are ever more multiplied and diversified, and their data storage and processing capacities have increased tremendously. In addition, the sizes of these electronic devices have decreased steadily, and their prices are also significantly reduced.

Nowadays, a variety of electronic devices are designed and developed to meet the requirements of our daily lives, such as a desktop computer, utilized for business operations and/or personal recreation and entertainment, a notebook computer, personal data assistant (PDA), mobile phone, smart phone, etc, utilized for easy carriage and operation.

Likewise, the volume of data processing incurred by the software used in the operation of these electronic devices also increases enormously. As such, the data storage capacity of a floppy diskette is no longer sufficient to use.

Though a compact disk having a large data storage capacity has subsequently been developed and introduced into the market, yet it is still subject to the shortcomings and disadvantages of being read only but not re-writeable.

As such, a special kind of electronic device called portable disk presently available on market can be utilized to solve the above-mentioned problem.

The size of portable disk is small and is thus easy to carry and operate, and it is provided with a rewritable large capacity memory. Therefore, it can be plugged in and connected to the electronic device such as a notebook computer or desk top computer, to conduct data transmission. The price of such a portable disk is pretty high in early and thus can not be popularized, yet its price is now very much cheaper due to the progress and improvement of the semiconductor manufacturing process. As such this kind of electronic device has become the standard gadget of businessmen and ordinary people.

In the prior art, the various portable disk manufacturing technologies are disclosed in the following Patents: U.S. Pat. No. 6,522,534 (hereinafter referred to as case 534), U.S. Pat. No. 6,744,634 (hereinafter referred to as case 634), U.S. Pat. No. 6,733,329 (hereinafter referred to as case 329), and U.S. Pat. No. 6,763,410 (hereinafter referred to as case 410). These documents are all incorporated herein for reference.

In case 534 is disclosed a pen-cap like mask body, which can be capped onto one end of a portable disk. When the mask body is put on the portable disk, the terminal on the portable disk can thus be shielded and protected. Similar designs are disclosed in case 634 and case 410. In case 410, the design of the mask body is further varied. For example, a connection piece is utilized to connect the mask body and the portable disk, so that when the mask body is detached from the portable disk, it is still connected to one side of the portable disk through the connection piece. In case 329, a similar mask body is utilized to protect the terminal portion. In addition, the terminal portion may be freely detached and replaced. As such, it is suitable to use for the connection ports of various types and specifications.

However, for the portable disks currently available on the market or disclosed in the afore-mentioned patents, it is evident that the protection of the terminal portion is the only function provided by the mask body of the portable disk. The fact is that the dispositions of various electronic elements in the portable disk are fixed and well set during the manufacturing process and thus can not be changed.

Therefore, if additional functions are desired, they have to be made in the product of the next version or next generation. Thus, if there were other means that could be used to enable the user himself to decide any additional functions of the portable disk available to use, that would be indeed a great benefit and convenience for the user.

SUMMARY OF THE INVENTION

In view of the above-mentioned problems and shortcomings of the prior art, the object of the invention is to provide a expandable function data storage device, which is used to enable the user to choose the required elements, to provide the various additional diversified functions of the data storage device.

Therefore, to achieve the above-mentioned objective, the present invention provides an expandable function data storage device and mainly includes a first main body and a second main body. A memory circuit unit and a power supply unit are provided inside the first main body and electrically connected to each other. The exposed first end of the first main body is provided with a first signal transmission port connected to the memory circuit unit, which is used to connect to the outside computer to transmit/receive data to/from each other, and then store the data in the memory unit. And the second end of the first main body is provided with a second signal transmission port. In addition, the second main body is provided with a reception space, so that it can be detached separately and sleeved onto the first end of the first main body, thus shielding and protecting the first signal transmission port. The inside of the second main body is provided with an application circuit unit, which is connected to a third signal transmission port in the reception space. As such, the second main body can be selectively sleeved on and connected to the second end of the first main body, so that the second signal transmission port can connect to the third signal transmission port, and thus the memory circuit unit is electrically connected to the application circuit unit.

In the application of the invention, various types of second main bodies may be utilized to suit the actual requirements of the user.

Further scope of the applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given below, which is for illustration only and thus is not limitative of the invention.

DETAILED DESCRIPTION OF THE INVENTION

The purpose, construction, features, and functions of the invention can be appreciated and understood more thoroughly through the following detailed description, with reference to the attached drawings.

Figure 1:
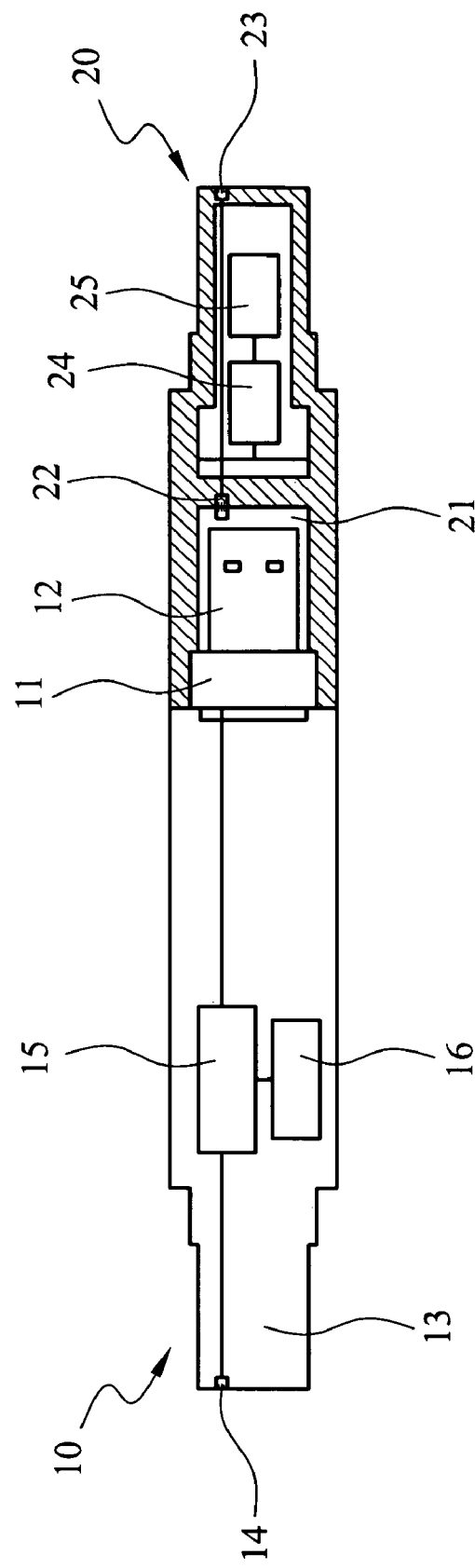
FIG. 1 is a schematic view of assembly of the first expandable function data storage device of the invention.
Figure 2:
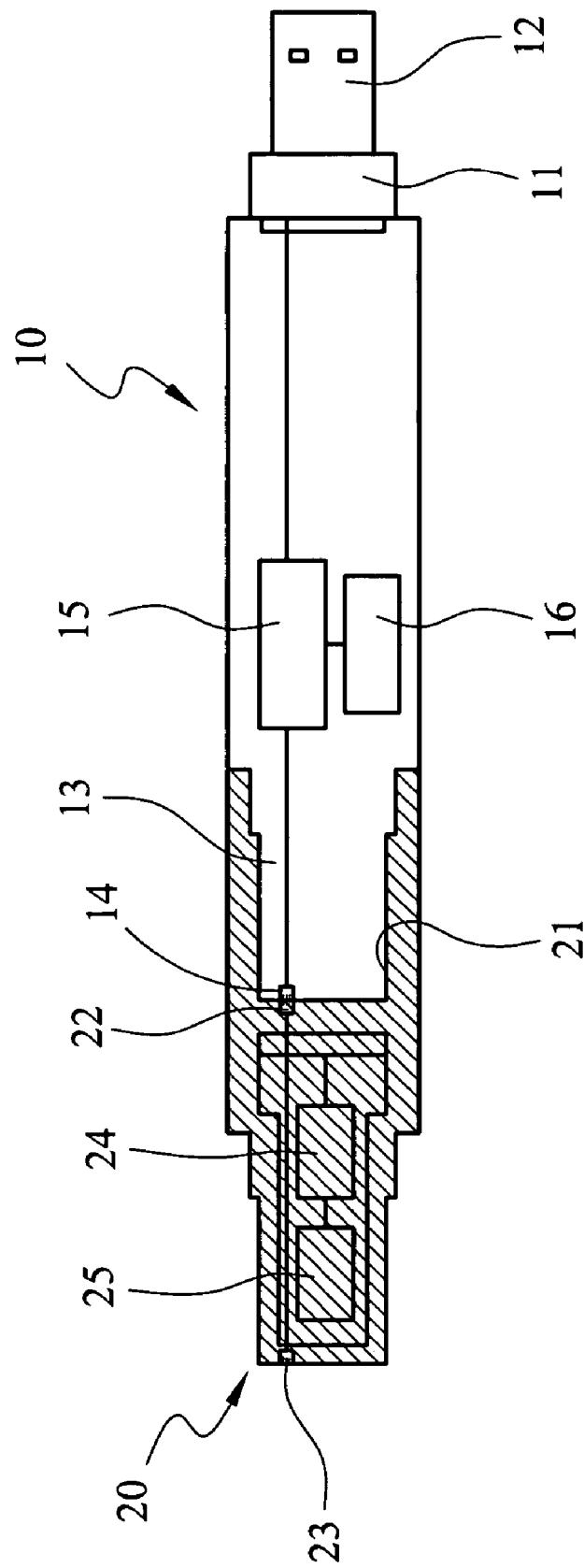
FIG. 2 is a schematic view of assembly of the second expandable function data storage device of the invention.

For a detailed description of the expandable function data storage device of the invention, please refer to FIGS. 1 and 2. The expandable function data storage device may include a first main body 10 and a second main body 20. The first end 11 of the first main body 10 is exposed outside and is provided with a first signal transmission port 12, and its second end 13 is provided with a second signal transmission port 14. The inside of the first main body 10 is provided with a memory circuit unit 15 and a power supply unit 16, connected to each other. Thus the memory unit 15 can be connected to various computers, disposed outside, such as a desktop computer and notebook computer (not shown), through the first signal transmission port 12, to transfer data and store them in the memory circuit unit 15. In a certain type of memory circuit unit 15, data can be kept and maintained without requiring the outside supplied power. Thus, in real practice, the power supply unit 16 may be omitted.

The second main body 20 is provided with a reception space 21, wherein an application circuit unit 24 and a driving power supply unit 25 are disposed. The inside of the reception space 21 is provided with a third signal transmission port 22, connected to the application circuit unit 24. The driving power supply unit 25 is used to provide the power required for the operation of the application circuit unit 24. The second main body 20 can be detached separately and sleeved on the first end 11 of the first main body 10, thus providing the function of shielding and protection, and preventing foreign objects such as dust from damaging the first signal transmission port 12.

In particular, the second main body 20 can be sleeved on and connected to the second end 13 of the first main body 10, so that the third signal transmission port 22 of the second main body 20 is connected to the second signal transmission port 14. As such, the second main body 20 is electrically connected to the first main body 10, so that the application circuit unit 24 and the memory circuit unit 15 may transmit data to each other. In addition, when the first main body 10 is connected to the outside computer (not shown), the driving power supply unit 25 may be charged through the third signal transmission port 22. In practice, the driving power supply unit 25 of the second main body 20 may be omitted, and the power required may be obtained from the power supply unit 16 of the first main body 10 through the third signal transmission port 22.

Figure 3:
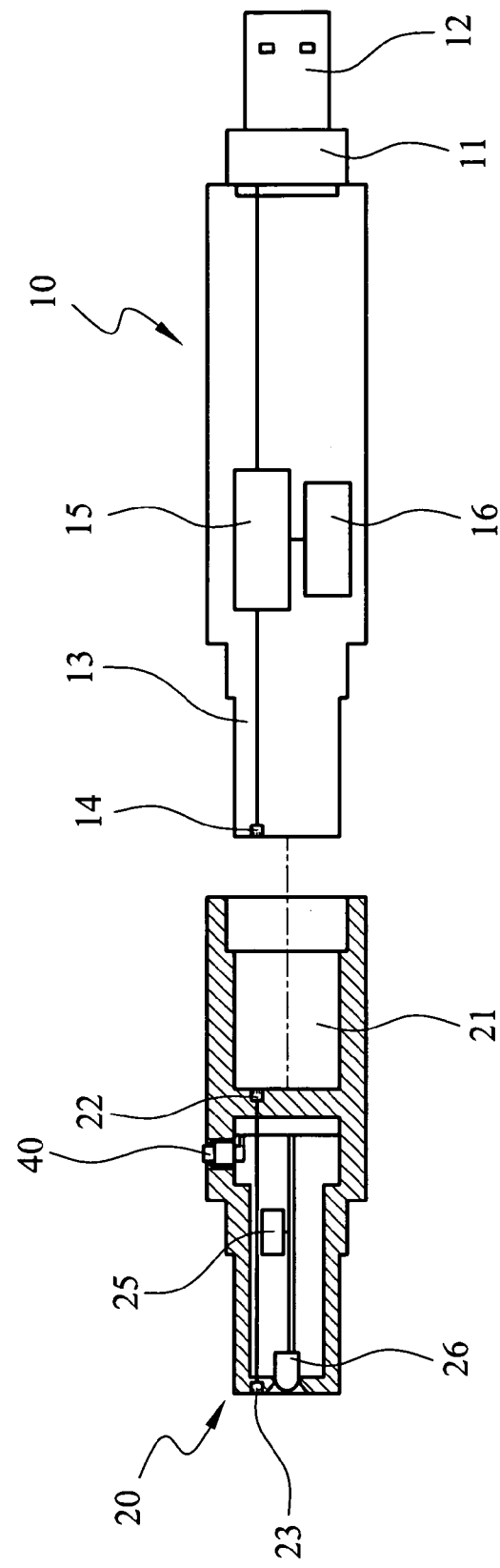
FIG. 3 is a schematic view of an expandable function data storage device according to the first preferred embodiment of the invention.
Figure 5:
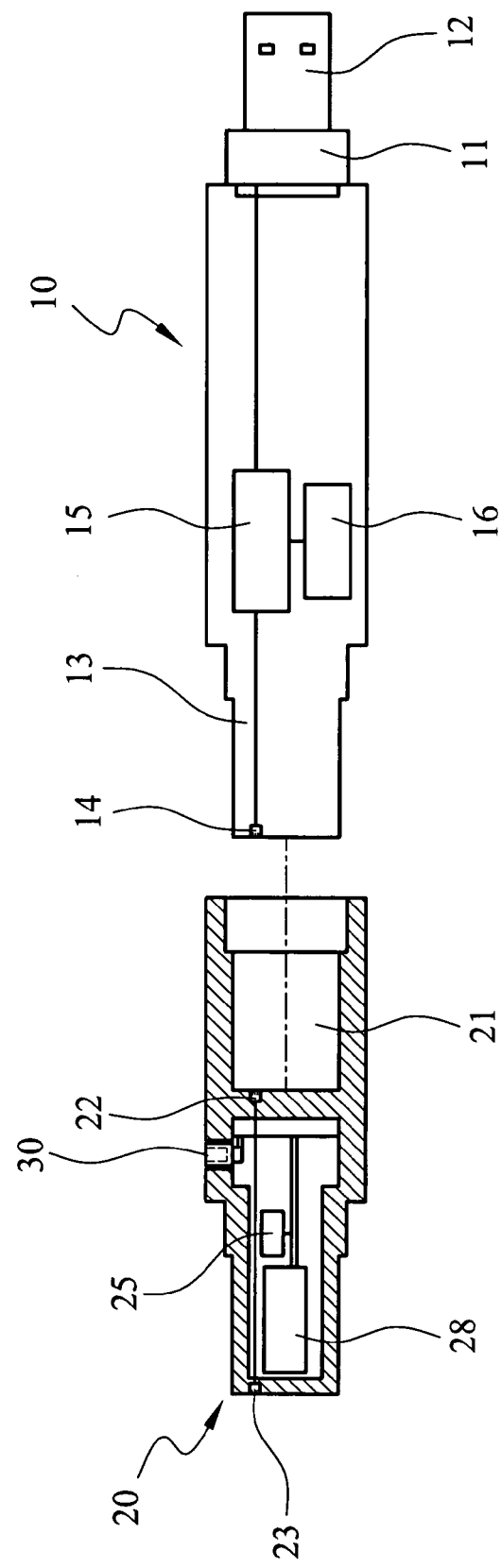
FIG. 5 is a schematic view of yet another expandable function data storage device according to the third preferred embodiment of the invention.

The composition of the basic elements of the invention and its operation are described above. Refer to FIGS. 3 and 5 for a further description of the functions of the second main body 20. Firstly, refer to FIG. 3, which is a schematic view of a function-expandable data storage device according to the first embodiment of the invention, wherein the application circuit unit mentioned above is a laser light pointer module 26, which is used to obtain the power of operation from the driving power supply unit 25, and proceed with the operation required through a press button 40 disposed on one side of the second main body 20. When the first main body 10 is connected to an outside computer, the power required for charging the driving power supply unit 25 may be obtained from the outside computer through the third signal transmission port 22. If the second main body 20 is not equipped with the driving power supply unit 25, then the power required may be obtained from the power supply unit 16 through the third signal transmission port 22.

Figure 4:
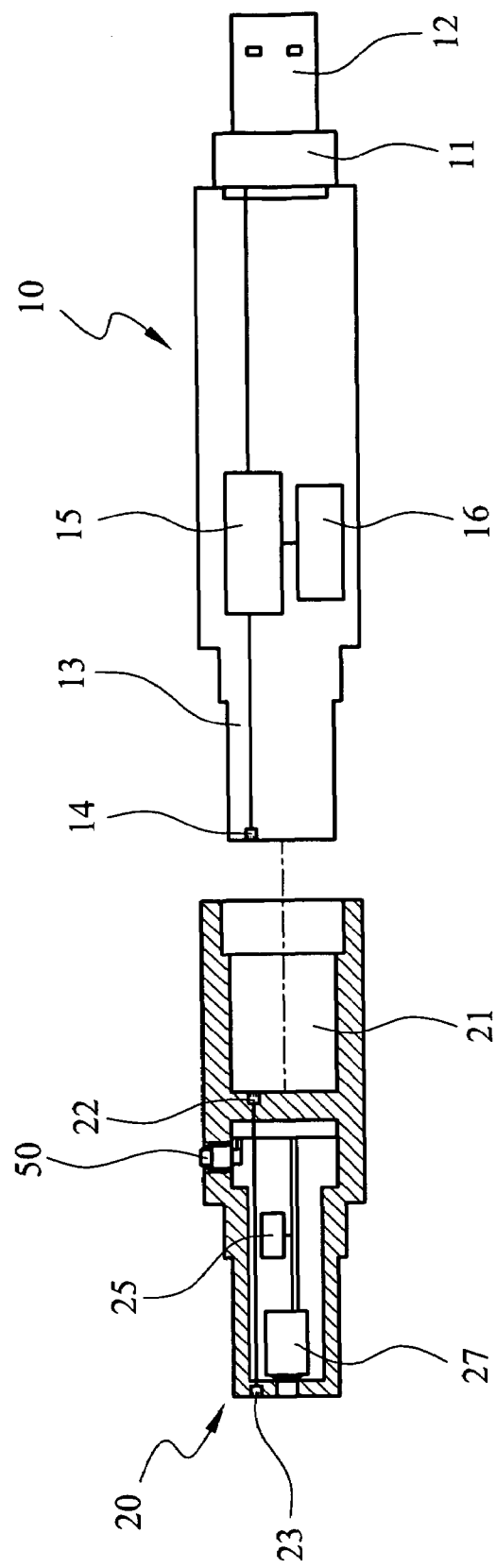
FIG. 4 is a schematic view of another expandable function data storage device according to the second preferred embodiment of the invention.

Next, refer to FIG. 4, which is a schematic view of another expandable function data storage device according to the second embodiment of the invention. As shown in FIG. 4, the application circuit unit mentioned above is in fact an illumination module 27, which is used to obtain the power of operation from the driving power supply unit 25, and proceed with the operation required to produce a certain degree of illumination through a press button 50 disposed on one side of the second main body 20. Likewise, when the first main body 10 is connected to an outside computer, the power required for charging the driving power supply unit 25 may be obtained from the outside computer through the third signal transmission port 22. If the second main body 20 is not equipped with the driving power supply unit 25, then the power required may be obtained from the power supply unit 16 through the third signal transmission port 22.

Then, refer to FIG. 5, which is a schematic view of yet another expandable function data storage device according to the third embodiment of the invention. As shown in FIG. 5, the application circuit unit mentioned above is actually an audio broadcasting module 28, which is used to obtain the power required from the driving power supply unit 25, proceed the data transmission with the memory circuit unit 15 through the third signal transmission port 22, and allow a plug-in of the outside broadcasting device, such as earphones or loudspeakers (not shown) through an audio plug-in hole 30 on one side of the second main body 20, to produce the sound required. Likewise, when the first main body 10 is connected to an outside computer, the power required for charging the driving power supply unit 25 may be obtained from the outside computer through the third signal transmission port 22. If the second main body 20 is not equipped with the driving power supply unit 25, then the power required may be obtained from the power supply unit 16 through the third signal transmission port 22.

Figure 6:
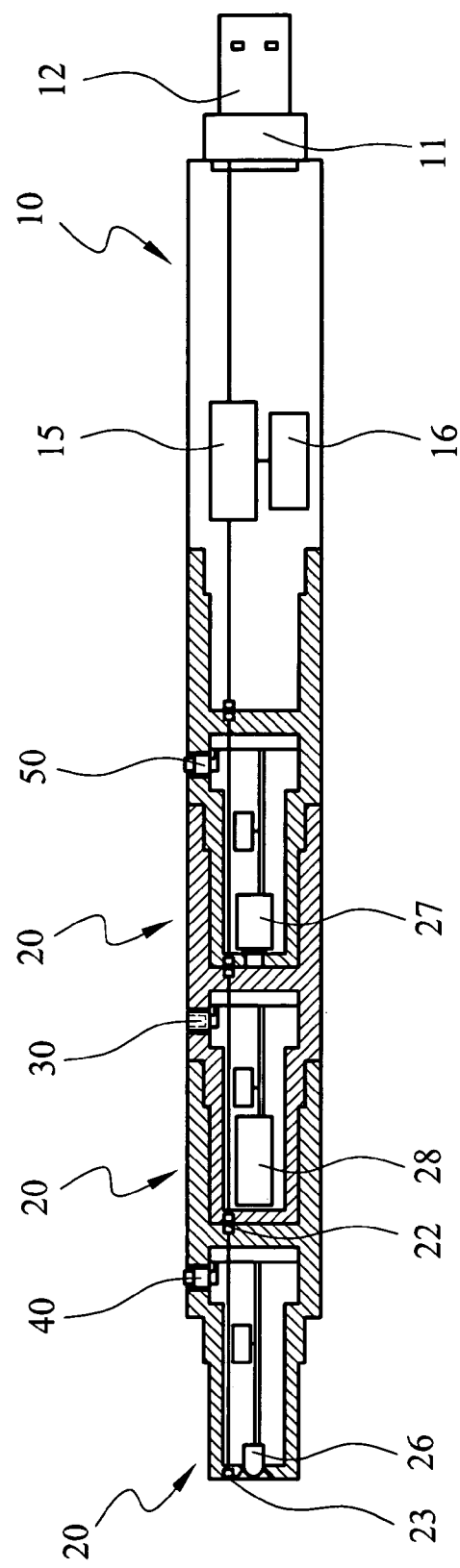
FIG. 6 is a schematic view of assembly of the third expandable function data storage device of the invention.

Finally, refer to FIG. 6, which is a schematic view of assembly of a third expandable function data storage device of the invention. For the people with ordinary knowledge in this field, it is conceivable that a fourth signal transmission port 23 may be provided at the front end of the second main body 20, to series-connect the second main bodies 20 of the above-mentioned embodiments. In addition, the first signal transmission port 12 may be connected to an outside computer, thus recharging the driving power supply units 25 in the second main bodies 20.

Through the application of the invention, the second main body 20 may be utilized to provide various additional functions, to satisfy the requirements of users, thus achieving the purpose of decreasing the product size and reducing the production cost.

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An expandable function data storage device, connected to a computer, comprising:
   a first main body comprising a memory circuit unit and a power supply unit connecting with each other, its first end being exposed outside and provided with a first signal transmission port connected to said memory circuit unit, so as to be connected to said computer and transmit data to each other, and store said data into said memory circuit unit, and the second end of said first main body being provided with a second signal transmission port electrically connected to said memory circuit unit; and
   a second main body, provided with a reception space, in a relationship of a detached and sleeved manner with said first end of said first main body, so as to shield and protect said first signal transmission port, an application circuit unit being provided in said second main body and connected to a third signal transmission port provided in said reception space,
   wherein said second main body can be selectively sleeved on and connected to said second end of said first main body, so that said second signal transmission port is connected to said third signal transmission port, such that said memory circuit unit is electrically connected to said application circuit unit.

2. The expandable function data storage device as claimed in claim 1, wherein said application circuit unit is a laser light pointer module.

3. The expandable function data storage device as claimed in claim 1, wherein said application circuit unit is an illumination module.

4. The expandable function data storage device as claimed in claim 1, wherein said application circuit unit is an audio broadcasting module.

5. The expandable function data storage device as claimed in claim 1, wherein the front end of said second main body is provided with a fourth signal transmission port, so that when said second main body is placed into the reception space of another second main body, said fourth signal transmission port of said second main body is connected to said third signal transmission port of said another second main body.

6. The expandable function data storage device as claimed in claim 2, wherein said laser light pointer module is used to obtain power from said power supply unit through said third signal transmission port.

7. The expandable function data storage device as claimed in claim 2, wherein said laser light pointer module is provided with a driving power supply unit, which is used to store the power required by the operation, and when said first main body is connected to said computer, it is used to obtained the power provided by said computer through said third signal transmission port, thus charging said driving power supply unit.

8. The expandable function data storage device as claimed in claim 3, wherein said illumination module is used to obtain the power required from said power supply unit through said third signal transmission port.

9. The expandable function data storage device as claimed in claim 3, wherein said illumination module is provided with a driving power supply unit, which is used to store the power required by the operation, and when said first main body is connected to said computer, it is used to obtained the power provided by said computer through said third signal transmission port, thus charging said driving power supply unit.

10. The expandable function data storage device as claimed in claim 4, wherein said audio broadcasting module transmit data to said memory circuit unit or receive data from said memory circuit unit through said third signal transmission port.

11. The expandable function data storage device as claimed in claim 4, wherein said audio broadcasting module is used to obtain the power required from said power supply unit through said third signal transmission port.

12. The expandable function data storage device as claimed in claim 4, wherein said audio broadcasting module is provided with a driving power supply unit, which is used to store the power required by the operation, and when said first main body is connected to said computer, the power required for operation is obtained from said computer through said third signal transmission port, thus charging said driving power supply unit.

13. An expandable function data storage device, connected to a computer, comprising:
   a first main body comprising a memory circuit unit, its first end being exposed outside and provided with a first signal transmission port connected to said memory circuit unit, so as to be connected to said computer and transmit data to each other, and store said data into said memory circuit unit, the second end of said first main body is provided with a second signal transmission port electrically connected to said memory circuit unit; and
   a second main body, provided with a reception space, in a relationship of a detached and sleeved manner with said first end of said first main body, so as to shield and protect said first signal transmission port, an application circuit unit and a driving power supply unit being provided in said second main body and connected to each other, and a third signal transmission port is provided in said reception space, and is connected to said application circuit unit,
   wherein said second main body can be selectively sleeved on and connected to said second end of said first main body, so that said second signal transmission port is electrically connected to said third signal transmission port.

14. The expandable function data storage device as claimed in claim 13, wherein said application circuit unit is a laser light pointer module.

15. The expandable function data storage device as claimed in claim 13, wherein said application circuit unit is an illumination module.

16. The expandable function data storage device as claimed in claim 13, wherein said application circuit unit is an audio broadcasting module.

17. The expandable function data storage device as claimed in claim 13, wherein the front end of said second body is provided with a fourth signal transmission port, so that when said second main body is placed into the reception space of another second main body, said fourth signal transmission port of said second main body is connected to said third signal transmission port of said another second main body.

18. The expandable function data storage device as claimed in claim 14, wherein when said first main body is connected to said computer, the power required for operation is obtained from said computer through said third signal transmission port, thus charging said driving power supply unit.

19. The expandable function data storage device as claimed in claim 15, wherein when said first main body is connected to said computer, the power required for operation is obtained from said computer through said third signal transmission port, thus charging said driving power supply unit.

20. The expandable function data storage device as claimed in claim 16, wherein said audio broadcasting module transmit data to said memory circuit unit or receive data from said memory circuit unit through said third signal transmission port.

21. The expandable function data storage device as claimed in claim 16, wherein when said first main body is connected to said computer, the power required for operation is obtained from said computer through said third signal transmission port, thus charging said driving power supply unit.

* * * * *